United States Patent
Barrington et al.

(10) Patent No.: US 6,662,718 B2
(45) Date of Patent: Dec. 16, 2003

(54) SCREENING MASK HAVING A STRESS-RELIEVING AREA

(75) Inventors: Evelyn Barrington, Poughkeepsie, NY (US); Jeffrey A. Brody, Hopewell Junction, NY (US); Harry David Cox, Rifton, NY (US); Lorraine Di Piero-Simmonds, Beacon, NY (US); John J. Garant, Hopewell Junction, NY (US); Dinesh Gupta, Hopewell Junction, NY (US); Edward J. Hassdenteufel, III, New Windsor, NY (US); Hsichang Liu, Fishkill, NY (US); Paul G. McLaughlin, Poughkeepsie, NY (US); Ahmed S. Shah, Wappingers Falls, NY (US); Charles Timothy Ryan, Poughkeepsie, NY (US); Richard C. Steger, New Windsor, NY (US); John A. Trumpetto, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 172 days.

(21) Appl. No.: 09/895,673

(22) Filed: Jun. 29, 2001

(65) Prior Publication Data

US 2003/0004076 A1 Jan. 2, 2003

(51) Int. Cl.[7] ............................................. B05C 17/06
(52) U.S. Cl. ........................................ 101/127; 101/123
(58) Field of Search .............................. 101/127, 127.1, 101/123

(56) References Cited

U.S. PATENT DOCUMENTS

| | | | | |
|---|---|---|---|---|
| 4,615,781 A | * | 10/1986 | Boudreau | 204/192.15 |
| 4,915,057 A | * | 4/1990 | Boudreau et al. | 118/505 |
| 5,669,972 A | * | 9/1997 | Cox et al. | 118/504 |
| 5,763,121 A | | 6/1998 | Randall | |
| 6,095,041 A | | 8/2000 | Comino et al. | |
| 6,103,427 A | | 8/2000 | Storm | |

* cited by examiner

Primary Examiner—Ren Yan
(74) Attorney, Agent, or Firm—Ira D. Blecker

(57) ABSTRACT

A screening mask having a stress-relieving area including an inner functional area having a pattern which is replicated on an underlying substrate, the inner functional area pattern having an one open area through which a paste is extruded and at least one tab, and an outer nonfunctional area distinct from the inner functional area, the outer nonfunctional area having a stress-relieving area adjacent to an edge of the screening mask that protects the at least one tab in the inner functional area from breaking.

16 Claims, 1 Drawing Sheet

SCREENING MASK HAVING A STRESS-RELIEVING AREA

BACKGROUND OF THE INVENTION

The present invention relates to a screening mask for screening patterns on substrates, and more particularly, relates to a screening mask having stress-relieving areas to prolong the life of the screening mask.

In the fabrication of packages for semiconductor devices and the like, it is necessary to deposit finely detailed wiring patterns of conductive material on insulative substrates such as those made from ceramic materials. The conductive patterns typically consist of wiring lines, via, pads and the like. In order to provide these conductive patterns, conductive paste is deposited on the insulative substrate through a screening mask.

Screening masks are typically made of a metallic material such as molybdenum, copper, nickel and the like. However, the material of the screening mask is not important to the present invention.

While the specific screening mask material is not germane to the present invention, it must nevertheless be sufficiently robust to withstand the rigors of screening. Screening masks are very thin, typically on the order of 2.5 to 4 mils, and are held in a frame during screening. The screening mask is drawn tight across the frame such that the screening mask is taut and held in tension. The conductive paste that is used for screening is typically very viscous. In one form of screening, so-called extrusion screening, the very viscous conductive paste is extruded through the apertures of the screening mask.

Separating the apertures of the screening masks are tabs which provide structural rigidity to the screening mask. The process of extrusion screening puts tremendous stresses on the screening mask, often causing the tabs to break. When a tab breaks, the screening mask must be discarded. Tab breakage is worst with screening masks having a high density wiring pattern. The pass factor, i.e., the number of substrates screened without breaking a tab, consequently decreases with an increase in wiring pattern density.

A conventional screening mask is disclosed in Comino et al. U.S. Pat. No. 6,095,041, the disclosure of which is incorporated by reference herein. As can be seen in FIG. 1 of the reference, the screening mask is principally open for screening of features except for tabs bridging the open features so as to provide structural rigidity to the screening mask.

Randall U.S. Pat. No. 5,763,121, the disclosure of which is incorporated by reference herein, discloses a lithographic stencil mask having a plurality of non-uniformly distributed stress relief openings in the active area of the stencil mask which relieve and equalize tensile stresses within the mask, thereby compensating for any non-uniform distribution of the pattern openings in the stencil mask.

Storm U.S. Pat. No. 6,103,427, the disclosure of which is incorporated by reference herein, discloses a pellicle having a continuous, tortuous path between the interior and exterior of the frame and gasket assembly so as to enable pressure equalization between the two spaces.

Notwithstanding these advances in the art, there remains a need for a screening mask design which substantially alleviates the problem of tab breakage.

Accordingly, it is a purpose of the present invention to have a screening mask design which substantially alleviates the problem of tab breakage.

It is another purpose of the present invention to have a screening mask design which has an increased pass factor.

These and other purposes of the present invention will become more apparent after referring to the following description considered in conjunction with the accompanying drawings.

BRIEF SUMMARY OF THE INVENTION

The purposes and advantages of the present invention have been achieved by providing, according to a first aspect of the present invention, a screening mask having a stress-relieving area comprising:

an inner functional area having a pattern which is replicated on an underlying substrate, the inner functional area pattern having at least one open area through which a paste is extruded and at least one tab; and an outer nonfunctional area distinct from the inner functional area, the outer nonfunctional area having at least one stress-relieving area adjacent to an edge of the screening mask that protects the at least one tab in the inner functional area from breaking.

According to a second aspect of the present invention, there is provided a screening mask assembly comprising:

a paste dispensing apparatus;

a screening mask frame; and a screening mask mounted in the frame, the screening mask having an inner functional area having a pattern which is replicated on an underlying substrate, the inner functional area pattern having at least one open area through which a paste is extruded and at least one tab, and the screening mask having an outer nonfunctional area distinct from the inner functional area, the outer nonfunctional area having at least one stress-relieving area adjacent to an edge of the screening mask;

wherein, in operation, when a paste is dispensed over and into the screening mask by the paste dispensing apparatus, stresses in the screening mask are absorbed by the at least one stress-relieving area, thereby preventing breakage of the at least one tab of the screening mask.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
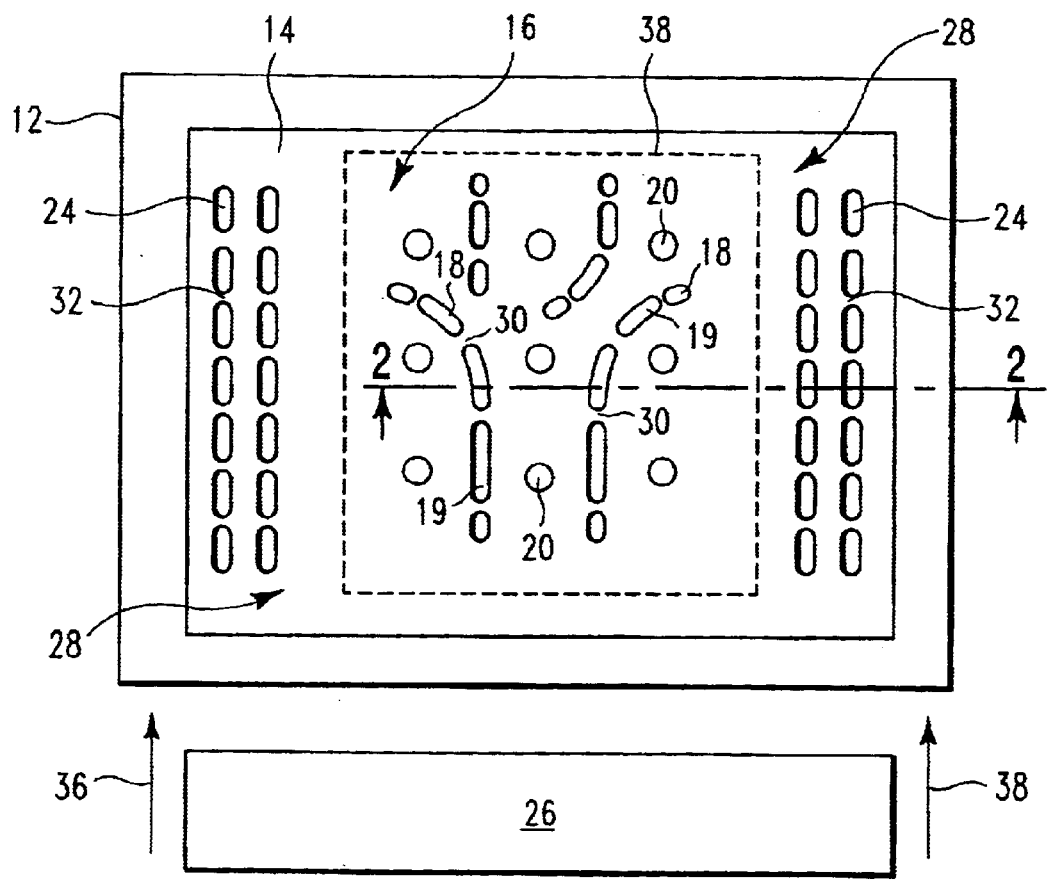
FIG. 1 is plan view of a frame and a screening mask having stress-relieving areas.

Referring to the Figures in more detail, and particularly referring to FIG. 1, there is shown a plan view of a frame/mask assembly 10 comprising a frame 12 and a screening mask 14. The screening mask 14 has an inner, active area 16, denoted by dotted lines 38, and an outer, inactive area 28. The active area 16 of the screening mask 14 has a pattern consisting of lines 18 and vias 20 which is to be replicated in an underlying substrate (not shown). Such an underlying substrate may include, for example, a ceramic greensheet. The pattern may also include other features that are not shown such as pads.

The lines 18 generally consist of apertures or open areas 19 through which a viscous paste is extruded onto the underlying substrate. To provide structural rigidity to the screening mask 14, the lines 18 have tabs 30 at predetermined intervals along the length of the lines.

The pattern is screened by traversing a paste dispenser, schematically illustrated by 26, in the direction of arrows 36. The paste is simultaneously dispensed and extruded into the apertures 19 of the lines 18 and vias 20 by paste dispenser 26.

As a consequence of the screening operation, certain of the tabs 30 may be stressed to the point of fracture, thereby rendering the screening mask 14 useless. Accordingly, the present inventors have proposed stress-relieving areas which substantially alleviate the problem of tab breakage.

Figure 2:
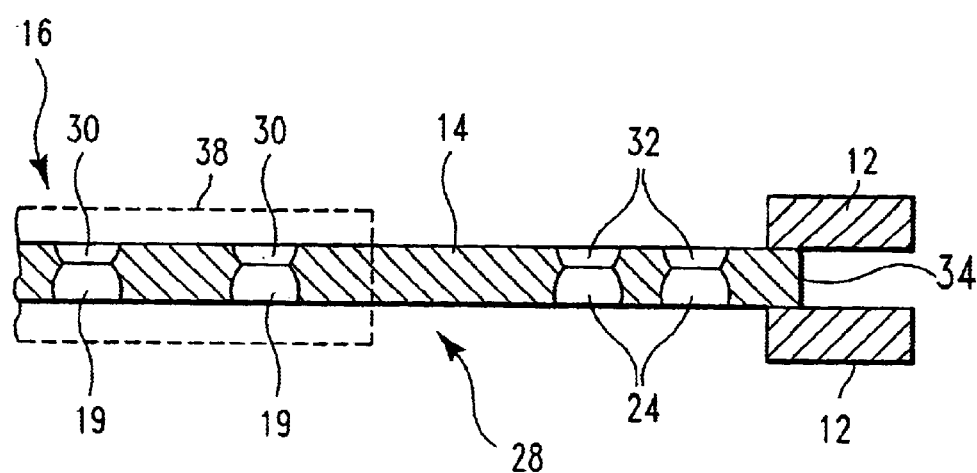
FIG. 2 is an enlarged cross-sectional view of the frame and screening mask of FIG. 1 along the lines II—II.

A preferred embodiment of the present invention is illustrated in FIGS. 1 and 2 where the stress-relieving features comprise apertures 24 separated by tabs 32. The apertures 24 preferably are the same size as those making up the lines 18 but could be smaller or larger depending on the circumstances. These stress-relieving features are located in the outer, inactive area 28 of the screening mask 14 and are adjacent to an edge 34 of the screening mask 14. Generally speaking, the apertures 24 from the view shown in FIG. 1 appear to be rectangular in shape. It is preferred that the corners of the rectangular apertures are rounded to increase the strength of the tabs.

The number and spacing of the stress-relieving features will vary depending on the density of the pattern features. In a preferred embodiment, the stress-relieving features are adjacent to opposed edges 34 of the screening mask 14. Further in the preferred embodiment, the stress-relieving features comprise at least one row, and most preferably more than one row, of alternating apertures 24 and tabs 32 as shown in FIG. 1. Most preferably, the apertures 24 and tabs 32, respectively, are regularly spaced apart, as also shown in FIG. 1. In addition to the apertures 24 and tabs 32 being regularly spaced apart, it is also most preferred that all of the apertures 24 and all of the tabs 32, respectively, are of the same size.

It has been found that in the preferred embodiment of the present invention, the rows of apertures 24 and tabs 32 are only adjacent to the edges 34 that are parallel to the direction of screening 36, as also shown in FIG. 1.

In operation of the screening mask 14 according to the present invention, paste dispenser 32 moves across the screening mask 14 in the direction of arrows 36 as shown in FIG. 1. During the initial use of the screening mask 14 in the screening operation, one or more of the tabs 32 break to relieve the stresses in the screening mask 14. This lets the tension on the mask stabilize at a level such that there is no further breakage of tabs 32 in subsequent screening. The end result is that only tabs 32 break, thereby protecting tabs 30 in the inner active area 16 of the screening mask 14 so as to prolong the life of the screening mask 14. Tabs 32 are essentially sacrificial in nature in that their breakage protects tabs 30 from breaking while not otherwise affecting the performance or utility of the screening mask 14.

It has been found that by virtue of the stress-relieving features disclosed herein, the pass factor has been increased approximately 300%.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A screening mask for screen printing a paste on a substrate having a stress-relieving area comprising:
    a sheet of material having an inner functional area contiguous with an outer nonfunctional area:
        the inner functional area having a pattern which is replicated via the paste on an underlying substrate, the inner functional area pattern having at least one open area through which the paste is extruded and at least one tab; and
        the outer nonfunctional area distinct and spaced from the inner functional area, the outer nonfunctional area having at least one stress-relieving area adjacent to and spaced from an edge of the screening mask that protects the at least one tab in the inner functional area from breaking during the screen printing operation.

2. The screening mask of claim 1 wherein the inner functional area pattern comprises a plurality of apertures with each aperture being separated from an adjacent aperture by a tab.

3. The screening mask of claim 1 wherein the stress-relieving area comprises a plurality of apertures with each aperture being separated from an adjacent aperture by a tab.

4. The screening mask of claim 3 wherein each aperture comprises a rectangle having rounded corners.

5. The screening mask of claim 1 wherein there are only two stress-relieving areas with each stress-relieving area adjacent to and spaced from an opposed edge of the mask and each stress-relieving area comprises a plurality of apertures with each aperture being separated from an adjacent aperture by a tab.

6. The screening mask of claim 5 wherein the plurality of apertures in each stress-relieving area comprises at least one row of apertures parallel to the edge of the screening mask with each aperture separated from an adjacent aperture by a tab.

7. The screening mask of claim 6 wherein the apertures and tabs, respectively, in the at least one row in each stress-relieving area are regularly spaced apart.

8. The screening mask of claim 6 wherein the apertures in the at least one row in each stress-relieving area are all of the same size and the tabs in the at least one row in each stress-relieving area are all of the same size.

9. A screening mask assembly comprising:
    a paste dispensing apparatus;
    a screening mask frame; and
    a screening mask mounted in the frame, the screening mask having an inner functional area having a pattern which is replicated on an underlying substrate, the inner functional area pattern having at least one open area through which a paste is extruded and at least one tab, and the screening mask having an outer nonfunctional area distinct from the inner functional area, the outer nonfunctional area having at least one stress-relieving area adjacent to an edge of the screening mask;
    wherein, in operation, when a paste is dispensed over and into the screening mask by the paste dispensing apparatus, stresses in the screening mask are absorbed by the at least one stress-relieving area, thereby preventing breakage of the at least one tab of the screening mask.

10. The screening mask assembly of claim 9 wherein the screening mask inner functional area pattern comprises a plurality of apertures with each aperture being separated from an adjacent aperture by a tab.

11. The screening mask assembly of claim 9 wherein the screening mask stress-relieving area comprises a plurality of apertures with each aperture being separated from an adjacent aperture by a tab, wherein at least one tab breaks during screening.

12. The screening mask assembly of claim 11 wherein each aperture of the screening mask comprises a rectangle having rounded corners.

13. The screening mask assembly of claim 9 wherein the screening mask has two stress-relieving areas with each stress-relieving area adjacent to an edge of the mask and each stress-relieving area comprises a plurality of apertures with each aperture being separated from an adjacent aperture by a tab, wherein at least one tab of one of the stress-relieving areas breaks during screening.

14. The screening mask assembly of claim 13 wherein the plurality of apertures in each stress-relieving area of the screening mask comprises at least one row of apertures parallel to the edge of the screening mask with each aperture separated from an adjacent aperture by a tab.

15. The screening mask assembly of claim 14 wherein the apertures and tabs, respectively, in the at least one row in each stress-relieving area are regularly spaced apart.

16. The screening mask of claim 14 wherein the apertures in the at least one row in each stress-relieving area are all of the same size and the tabs in the at least one row in each stress-relieving area are all of the same size.

* * * * *